(12) United States Patent
Pohan

(10) Patent No.: US 7,259,376 B2
(45) Date of Patent: Aug. 21, 2007

(54) DETECTOR MODULE

(75) Inventor: Claus Pohan, Baiersdorf (DE)

(73) Assignee: Siemens Aktiengesellschaft, Munich (DE)

( * ) Notice: Subject to any disclaimer, the term of this patent is extended or adjusted under 35 U.S.C. 154(b) by 395 days.

(21) Appl. No.: 10/892,345

(22) Filed: Jul. 16, 2004

(65) Prior Publication Data

US 2005/0012047 A1  Jan. 20, 2005

(30) Foreign Application Priority Data

Jul. 16, 2003  (DE) ............................... 103 32 333

(51) Int. Cl.
*G01T 1/20* (2006.01)
(52) U.S. Cl. ...................... 250/370.09; 439/86; 439/91
(58) Field of Classification Search ................. 439/86, 439/90, 91; 250/370.09
See application file for complete search history.

(56) References Cited

U.S. PATENT DOCUMENTS

| | | | | |
|---|---|---|---|---|
| 5,152,868 A | * | 10/1992 | Schiltz et al. ................. 216/18 |
| 5,786,597 A | * | 7/1998 | Lingren et al. ......... 250/370.09 |
| 5,846,094 A | * | 12/1998 | Murray et al. ................ 439/91 |
| 6,019,610 A | * | 2/2000 | Glatts, III .................... 439/66 |
| 6,133,072 A | | 10/2000 | Fjelstad |
| 6,133,574 A | | 10/2000 | Blendinger |
| 6,510,195 B1 | * | 1/2003 | Chappo et al. ................ 378/19 |
| 6,671,345 B2 | * | 12/2003 | Vrettos et al. ................ 378/19 |
| 6,760,404 B2 | * | 7/2004 | Saito et al. ................. 378/98.8 |
| 6,859,232 B1 | * | 2/2005 | Tonami et al. .............. 348/302 |
| 2002/0064252 A1 | | 5/2002 | Igarashi et al. |
| 2002/0163993 A1 | * | 11/2002 | Hoffman et al. .............. 378/19 |
| 2003/0016779 A1 | | 1/2003 | Pohan et al. |
| 2004/0065465 A1 | * | 4/2004 | Chappo et al. ................ 174/66 |
| 2005/0061985 A1 | * | 3/2005 | Hoffman ................. 250/370.01 |

FOREIGN PATENT DOCUMENTS

| | | |
|---|---|---|
| DE | 690 13 104 T2 | 3/1995 |
| DE | 195 09 202 A1 | 9/1995 |
| DE | 197 28 237 A1 | 1/1999 |
| DE | 101 58 021 A1 | 8/2002 |
| DE | 101 35 288 A1 | 2/2003 |
| EP | 0 415 541 B1 | 10/1994 |
| WO | WO 00/75996 A1 | 12/2000 |
| WO | WO 01/08187 A1 | 2/2001 |

OTHER PUBLICATIONS

A Contact-Type Linear Sensor With A GD a-Si:H Photodetector Array, IEDM 81-313 to IEDM 81-316,1981 IEEE).*

* cited by examiner

*Primary Examiner*—David Porta
*Assistant Examiner*—Djura Malevic
(74) *Attorney, Agent, or Firm*—Harness, Dickey & Pierce, P.L.C.

(57) ABSTRACT

A detector module includes a plurality of detector elements, each of which is provided with a first contact point. Further, a circuit board includes second contact points. In order to be able to electrically connect a larger number of detector elements to the circuit board, the first contact points and the second contact points are arranged in a congruent grid and are electrically connected by an electrical elastomer connector.

40 Claims, 2 Drawing Sheets

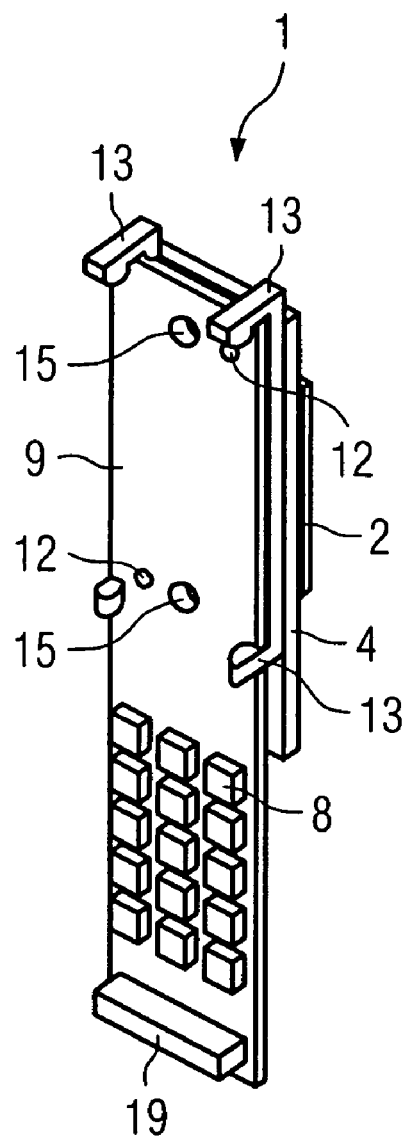
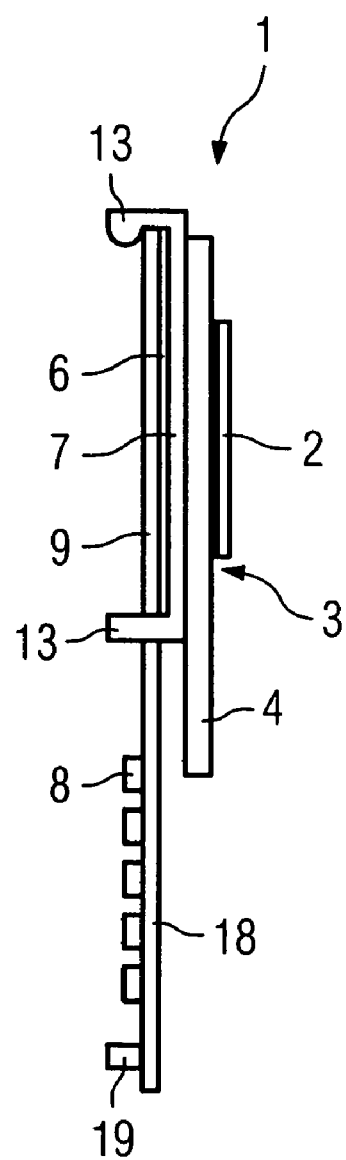

DETECTOR MODULE

The present application hereby claims priority under 35 U.S.C. §119 on German patent application number DE 103 32 333.3 filed Jul. 16, 2003, the entire contents of which are hereby incorporated herein by reference.

FIELD OF THE INVENTION

The invention generally relates to a detector module. It furthermore generally relates to a detector, in particular for an X-ray computer tomograph.

BACKGROUND OF THE INVENTION

Such detector modules are used, for example, in detectors for X-ray computer tomographs. Incident X-rays are in this case converted into photons by a scintillator. A photodiode converts the photons into an electrical signal. The scintillator and the photodiodes are combined in a detector element. The detector element is connected to evaluation electronics, which convert the analog electrical signals into corresponding digital signals.

A multiplicity of detector elements are combined in a detector module. The greater the number and the smaller the size of the detector elements in a detector module, the better the quality and the performance of the detector modules and of the detectors equipped with them. The trend is therefore toward increasing the number of detector elements in a detector module.

Since each detector element needs to be connected to the downstream evaluation electronics, the number of contacts in plug-in connectors for connecting the detector elements to the evaluation electronics also needs to increase when the number of detector elements is increased. Commercially available plug-in connectors have a limited number of contacts, however, so that it is generally possible to increase the contact number only by using a plurality of plug-in connectors. But this leads to problems relating to exact alignment of the plugs with one another, and entails an increased space requirement for the plug-in connector housing.

DE 197 28 237 A1 describes a radiation-electrical transducer. A contact layer provided on the photodiode chip is in this case connected to the scintillator by way of a contact track which is in contact with the contact layer and is placed on the scintillator.

SUMMARY OF THE INVENTION

DE 197 28 237 A1 does not mention anything about connecting the photodiode chip to the downstream evaluation electronics. It is an object of an embodiment of the invention to overcome at least one the disadvantage of the prior art. It is a particular object of at least one embodiment to provide an electrical connection of individual detector elements to downstream evaluation electronics, which allows contact to be made with a large number of detector elements with a space requirement that at least remains constant.

According to an embodiment of the invention, the first contact points and the second contact points are arranged in a congruent grid and are electrically connected by way of an electrical elastomer connector. The use of an electrical elastomer connector allows contact to be made with a large number of detector elements with a minimal space requirement. The plug-in connector housing which takes up a great deal of space can be avoided.

Since it is possible to obviate the electrical plug-in connectors used previously, the expensive soldering work can also be avoided. Instead of having to use a plurality of plug-in connectors when the number of detector elements increases, the electrical connection of the detector elements to the evaluation electronics can be produced by a single multipin connection. The electrical elastomer connector according to an embodiment of the invention may be extremely cost-efficient compared with the electrical plug-in connectors used previously.

In an advantageous refinement, the electrical elastomer connector may have electrically conductive structures arranged mutually parallel. Such electrically conductive structures arranged mutually parallel are expediently gold wires. The gold wires may be incorporated in a plate-like elastomer substrate. The gold wires may have a diameter of 50 micrometers. In this way, it is possible to achieve a very small distance between the gold wires and a good electrical conductivity. Spacings of less than 0.05 millimeters between the individual gold wires are possible. It is possible to achieve a large number of connection contacts within a very narrow space.

As an alternative, it is also possible for the electrical elastomer connector to have layers of electrically conductive sections and electrically nonconductive sections. Electrically conductive sections may, for example, be provided with graphite as a conductor. Such electrical elastomer connections can be mass-produced in large batches with a favorable unit price.

In a refinement of an embodiment of the invention, the electrical elastomer connector is held in a positioning frame between a module board holding the detector elements and the circuit board. The positioning frame is used to position the electrical elastomer connector between the module board and the circuit board, so that the electrically conductive structures of the electrical elastomer connector can be reliably connected to the contacts which need to be connected together. The positioning frame is also used to fix the elastomer connector, so that it stays in its position even in the event of vibrations or impact. The positioning frame is furthermore used as a spacer. This avoids excessive compression of the elastomer connector when the detector module is being assembled.

The positioning frame preferably has holes and/or positioning pins for engagement with holes and/or positioning pins formed on the module board and on the circuit board. The positioning frame can be aligned exactly with the module board and the circuit board by the holes and positioning pins, in order to insure that contact is reliably made between the elastomer connector and the contacts on the module board, and between the elastomer connector and the contacts on the circuit board.

The positioning frame may expediently be screwed to the module board and the circuit board, and/or connected to them by snap-fit connections. The screwing and/or snap-fit connection insures a requisite prestressing force, by which the elastomer connector is held in its intended position.

According to another refinement, the circuit board may carry at least one integrated circuit. This may be an application-specific integrated circuit, a so-called ASIC, in which case the spacings of the first contact points and second contact points in the grid may be from 0.2 to 0.8 millimeters, preferably from 0.3 to 0.6 millimeters. The accurate matching of the grid distribution between the module board and the circuit board permits a reliable electrical connection using the elastomer connector, in particular when the gold wires are arranged parallel in the elastomer connector.

In order to achieve an object of an embodiment, a detector is furthermore provided, in particular for an X-ray computer tomograph, which has a multiplicity of detector elements. The detector can thus accommodate future detector modules with improved quality and improved performance, so that the quality and performance of the detector will be automatically increased.

BRIEF DESCRIPTION OF THE DRAWINGS

A non-limiting exemplary embodiment of the invention will be explained in more detail below with reference to the drawings, in which:

FIG. 2 shows a perspective representation of the detector module in FIG. 1 when it is assembled, and FIG. 3 shows a side view of the assembled detector module in FIG. 2.

DETAILED DESCRIPTION OF THE PREFERRED EMBODIMENTS

Figure 1:
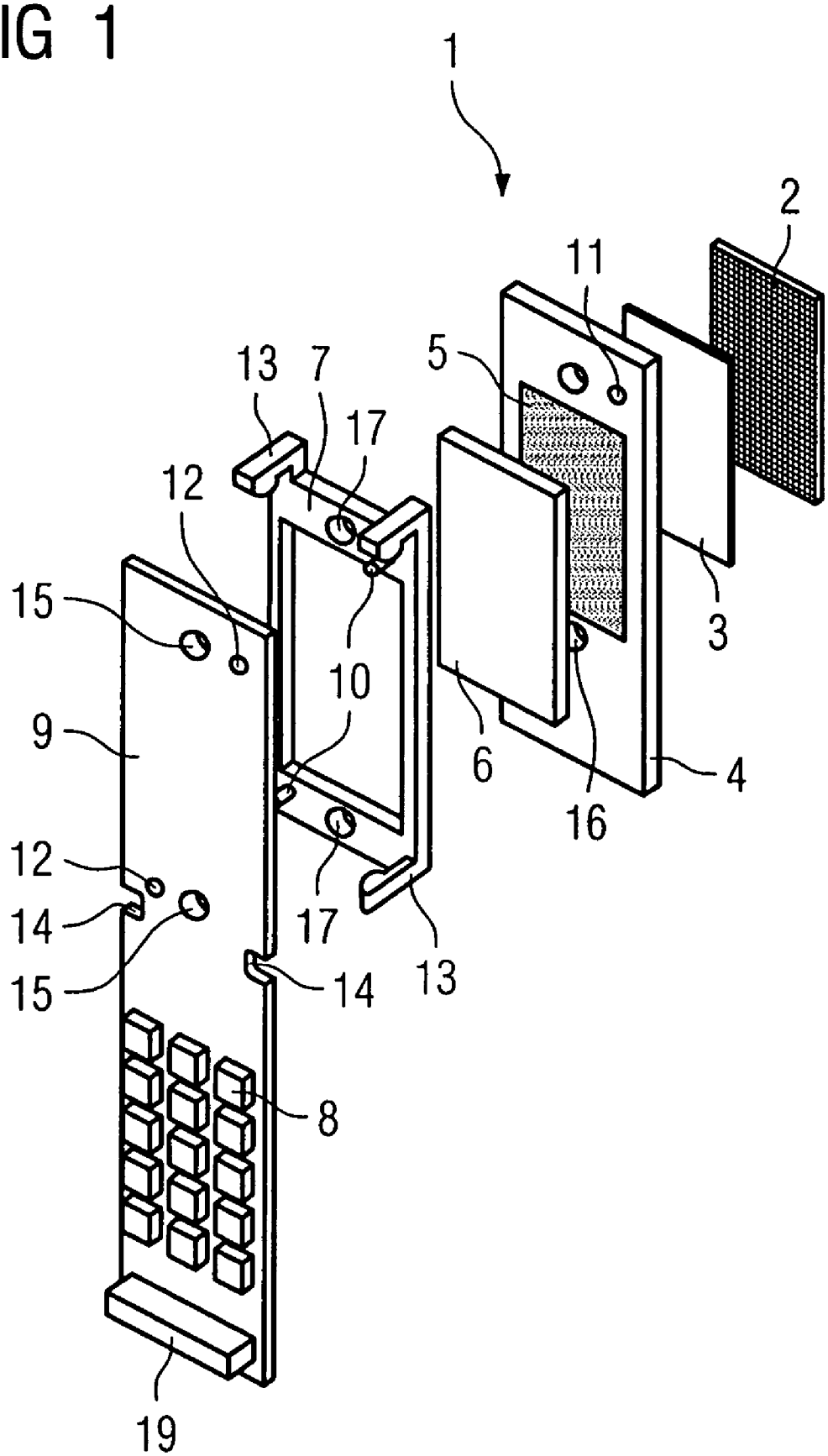
FIG. 1 shows an exploded perspective representation of a detector module.

FIGS. 1 to 3 show a detector module 1. The detector module 1 has a scintillator arrangement 2 and a photodiode arrangement 3. Each scintillator of the scintillator arrangement 2 and each photodiode of the photodiode arrangement 3, which is assigned to one of the scintillators, together form a detector element. The photodiode arrangement 3 has its active side facing the scintillator arrangement 2. The scintillator arrangement 2 converts incident X-rays into light, which is converted into electrical signals by the photodiode arrangement 3.

Together with the scintillator arrangement 2 placed on it, the photodiode arrangement 3 is arranged on a module board 4. The module board 4 is provided with a multiplicity of first contact points 5. The number of first contact points 5 corresponds precisely to the number of detector elements, which are electrically connected to the first contact points 5 by way of a through-contact extending through the board.

An electrical elastomer connector 6 is arranged by way of a positioning frame 7 between the module board 4 and a circuit board 9, which carries evaluation electronics 8. On the side of the circuit board 9 which cannot be seen in FIGS. 1 to 3, there are second contact points (also not shown here) which are to be connected to the first contact points 5 by the electrical elastomer connector 6. The first contact points 5 and the second contact points are arranged in the same grid. The grids formed by the contact points are congruent.

The elastomer connector 6 may include a multiplicity of gold wires arranged mutually parallel, with a diameter of at most 50 micrometers. The gold wires are arranged parallel to the shortest edge of the elastomer connector 6, that is to say they extend perpendicular to a main face of the elastomer connector 6. When the elastomer connector 6 is being fitted between the module board 4 and the circuit board 9, the gold wires become connected to the corresponding contact points to be connected together.

The positioning frame 7 positions the elastomer connector 6 exactly in the intended position on the first contact points 5 and on the second contact points. In order to be able to carry out this positioning reliably, the positioning frame 7 has positioning pins 10 which engage in positioning holes 11 and 12 when the detector module 1 is being assembled. The positioning frame 7 also has snap hooks 13, which snap into correspondingly provided holes 14 when the detector module 1 is being assembled.

The detector module 1 may furthermore be held together by screws (not represented in detail) which can be screwed into the holes 15, 16 and 17. The snap-fit and screw connections then provide a prestressing force, which holds the elastomer connector 6 in its intended position.

In order to prevent the elastomer connector 6 from being compressed excessively by the prestressing force, the positioning frame 7 also fulfills the function of a spacer. The circuit board 9 has a protruding region 18 on which the evaluation electronics 8 are arranged. Arranging the evaluation electronics 8 on the protruding region 18 is intended to protect the evaluation electronics 8 against X-radiation which strikes the detector elements 1.

The signals digitized by way of the evaluation electronics 8 are delivered to the system electronics through a conventional plug-in connector 19.

Exemplary embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A detector module, comprising:
a plurality of detector elements, each provided with a first contact point; and
a circuit board having second contact points, wherein the first contact points and the second contact points are arranged in a congruent grid and are electrically connected by way of an electrical elastomer connector;
wherein the electrical elastomer connector is held in a positioning frame between a module board holding the detector elements and the circuit board.

2. The detector module as claimed in claim 1, wherein the electrical elastomer connector includes electrically conductive structures arranged mutually parallel.

3. The detector module as claimed in claim 2, wherein the electrically conductive structures arranged mutually parallel, are gold wires.

4. The detector module as claimed in claim 3, wherein the gold wires are incorporated in a plate-like elastomer substrate.

5. The detector module as claimed in claim 3, wherein the gold wires include a diameter of at most 50 micrometers.

6. The detector module as claimed in claim 3, wherein the gold wires include a distance of less than 0.05 millimeters between one another.

7. The detector module as claimed in claim 1, wherein the electrical elastomer connector includes layers of electrically conductive sections and electrically nonconductive sections.

8. The detector module as claimed in claim 1, wherein the positioning frame includes at least one of holes and positioning pins for engagement with at least one of holes and positioning pins formed on the module board and on the circuit board.

9. The detector module as claimed in claim 1, wherein the positioning frame is screwed to the module board and the circuit board.

10. The detector module as claimed in claim 1, wherein the positioning frame is connected to the module board and the circuit board by snap-fit connections.

11. The detector module as claimed in claim 1, wherein the circuit board carries at least one integrated circuit.

12. The detector module as claimed in claim 1, wherein the spacings of the first contact points and second contact points in the grid are from 0.2 to 0.8 millimeters.

13. A detector, comprising a plurality of detector modules as claimed in claim 1.

14. The detector module as claimed in claim 4, wherein the gold wires include a diameter of at most 50 micrometers.

15. The detector module as claimed in claim 4, wherein the gold wires include a distance of less than 0.05 millimeters between one another.

16. The detector module as claimed in claim 5, wherein the gold wires include a distance of less than 0.05 millimeters between one another.

17. The detector module as claimed in claim 14, wherein the gold wires include a distance of less than 0.05 millimeters between one another.

18. The detector module as claimed in claim 8, wherein the positioning frame is screwed to the module board and the circuit board.

19. The detector module as claimed in claim 8, wherein the positioning frame is connected to the module board and the circuit board by snap-fit connections.

20. The detector module as claimed in claim 9, wherein the positioning frame is connected to the module board and the circuit board by snap-fit connections.

21. The detector module as claimed in claim 18, wherein the positioning frame is connected to the module board and the circuit board by snap-fit connections.

22. The detector module as claimed in claim 1, wherein the spacings of the first contact points and second contact points in the grid are from 0.3 to 0.6 millimeters.

23. The detector of claim 13, wherein the detector is for an X-ray computer tomograph.

24. A detector module, comprising:
   a plurality of detector elements, each provided with a first contact point; and
   an electrical elastomer connector, for electrically connecting the first contact points with second contact points of the detector module;
   wherein the electrical elastomer connector is held in a positioning frame between a module board holding the detector elements and a circuit board, including the second contact points.

25. The detector module of claim 24, wherein the second contact points are arranged on a circuit board.

26. The detector module of claim 24, wherein the first and second contact points are arranged in a grid.

27. The detector module of claim 24, further comprising a circuit board, housing the second contact points.

28. The detector module as claimed in claim 24, wherein the electrical elastomer connector includes electrically conductive structures arranged mutually parallel.

29. The detector module as claimed in claim 28, wherein the electrically conductive structures arranged mutually parallel, are gold wires.

30. The detector module as claimed in claim 29, wherein the gold wires are incorporated in a plate-like elastomer substrate.

31. The detector module as claimed in claim 29, wherein the gold wires include a diameter of at most 50 micrometers.

32. The detector module as claimed in claim 29, wherein the gold wires include a distance of less than 0.05 millimeters between one another.

33. The detector module as claimed in claim 24, wherein the electrical elastomer connector includes layers of electrically conductive sections and electrically nonconductive sections.

34. A detector, including a plurality of detector modules, each of the detector modules, comprising:
   a plurality of detector elements, each provided with a first contact point; and
   an electrical elastomer connector, for electrically connecting the first contact points with second contact points of the detector module;
   wherein the electrical elastomer connector is held in a positioning frame between a module board holding the detector elements and the circuit board including the second contact points.

35. The detector as claimed in claim 34, wherein the electrical elastomer connector includes electrically conductive structures arranged mutually parallel.

36. The detector as claimed in claim 35, wherein the electrically conductive structures arranged mutually parallel, are gold wires.

37. The detector as claimed in claim 36, wherein the gold wires are incorporated in a plate-like elastomer substrate.

38. The detector as claimed in claim 36, wherein the gold wires include a diameter of at most 50 micrometers.

39. The detector as claimed in claim 36, wherein the gold wires include a distance of less than 0.05 millimeters between one another.

40. The detector as claimed in claim 34, wherein the electrical elastomer connector includes layers of electrically conductive sections and electrically nonconductive sections.

* * * * *